Jan. 13, 1970 TOSHIKAZU MASUDA 3,489,964

OVERLAY TRANSISTOR

Filed Sept. 21, 1967 2 Sheets-Sheet 2

United States Patent Office 3,489,964

Patented Jan. 13, 1970

3,489,964

OVERLAY TRANSISTOR

Toshikazu Masuda, Yokohama-shi, Japan, assignor to Fujitsu Limited, Kawasaki, Japan, a corporation of Japan Filed Sept. 21, 1967, Ser. No. 669,577
Claims priority, application Japan, Sept. 22, 1966, 41/63,314
Int. Cl. H01l 11/00, 15/00, 3/00
U.S. Cl. 317—235 1 Claim

ABSTRACT OF THE DISCLOSURE

Described is a transistor wherein a plural number of narrow and long base regions are provided in parallel within the semiconductor substrate with each of the base regions having high concentration regions and emitter regions of the width substantially the same as that of the base region provided alternately therein. The base regions and the emitter regions are connected, respectively, by a common base electrode and a common emitter electrode which are arranged in parallel and crossing with the base regions. The process herein for preparing a transistor uses a two-step exposure of a light sensitive resin, in which the resin is first exposed using a first glass mask, then exposed using a second glass mask with relative position such that the second pattern crosses the first pattern.

Figure 1:
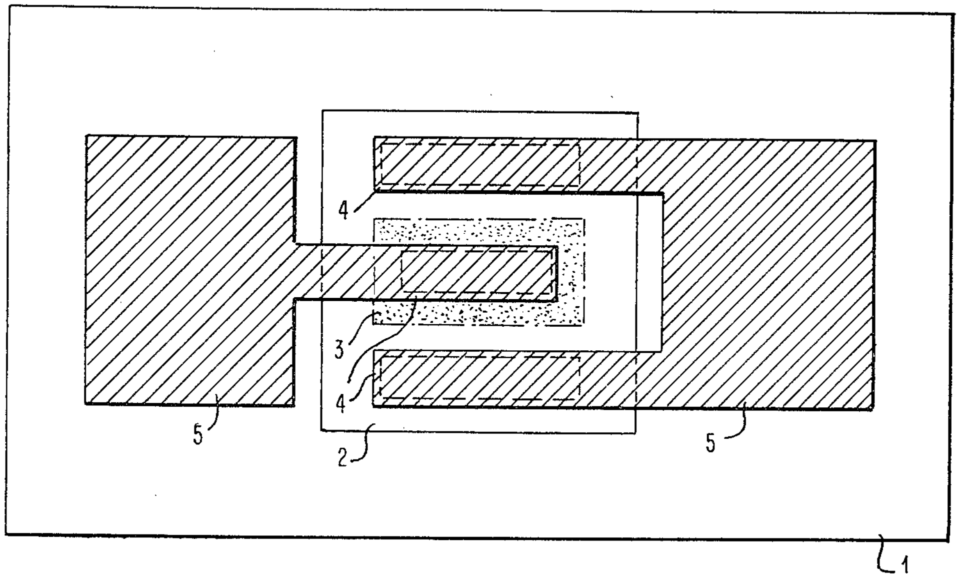

The present invention relates to transistor structure and the method of manufacturing the same.

Since the invention will be described in detail with respect to prior art as shown by the drawing, the drawing will first be briefly described.

Figure 2:
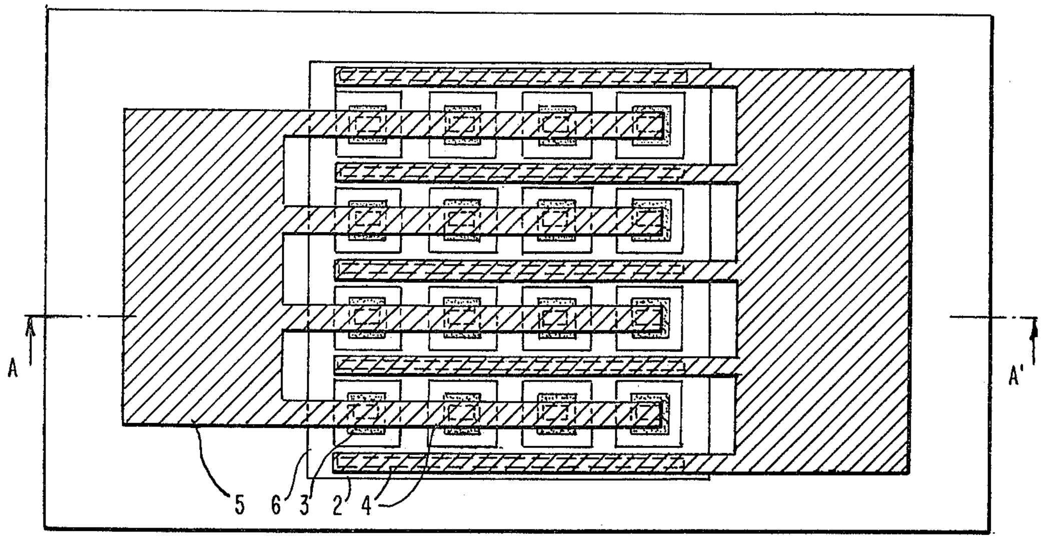
Figure 3:
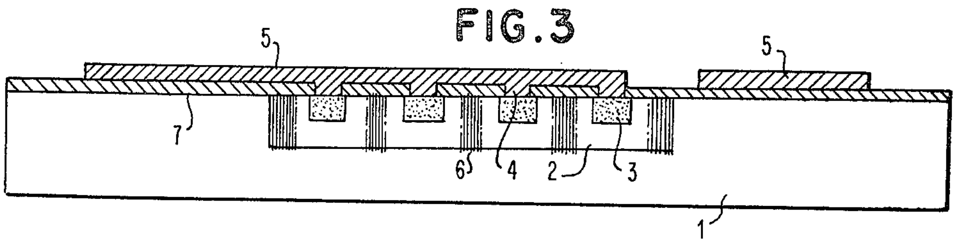
Figure 4:
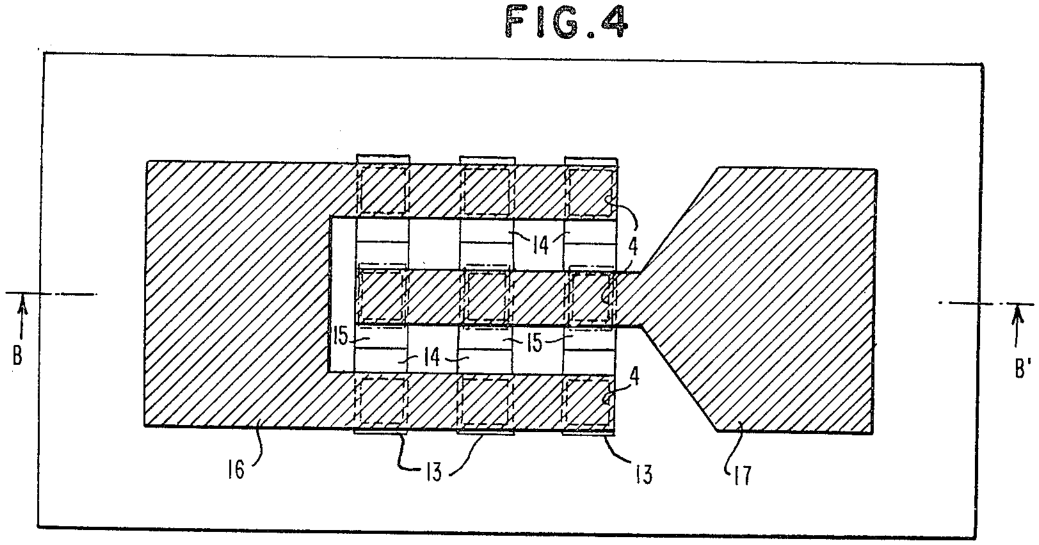
Figure 5:
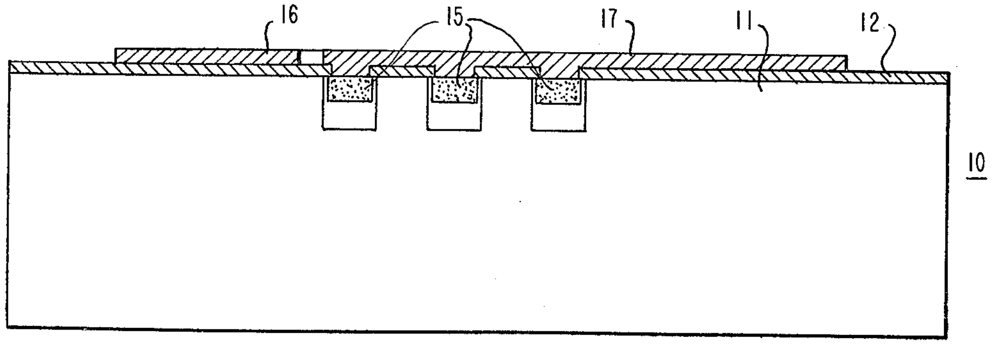

FIGS. 1 through 3 show the structures of conventional transistors and FIGS. 4 and 5 show the structure of the transistor of this invention.

Conventional diffusion type transistors have the structure shown in FIG. 1, and are fabricated as follows. First a p-type (or n-type) dopant impurity is diffused into an n-type (or p-type) semiconductor substrate 1 to form a base region 2. An n-type (or p-type) dopant impurity is then diffused into a part or parts of the applicable base region 2 to form emitter region 3. Thereafter the surface is oxidized, and windows 4 are etched therein at the base region and the emitter region for contact with electrodes. Finally base and emitter electrodes 5 are set up in a contacting relationship with the windows 4. While the foregoing procedures are for the "planar-type" structure, substantially the same procedures are employed for making the "mesa-type" structure.

Recently a structure known as "overlay" has been invented. The effectiveness of this has been gaining an increasing recognition particularly in connection with power transistor. The overlay structure is as shown in FIG. 2, and is made as follows: First, a p-type (n-type) dopant impurity is diffused into n-type (or p-type) semiconductor substrate 1, to form a base region 2. P-type (or n-type) dopant impurity is diffused at higher concentration into the applicable region 2, to form a reticulated or web-like low resistance part 6 to decrease the base resistance. The order of making the region 2 and the part 6 may be reversed. N-type (or p-type) dopant impurity is further diffused into the control portion of each of the devices, to form an emitter region 3. This is followed by the opening windows in the oxidized surface film, formed during the diffusion step, for contact of electrodes to the base and the emitter regions. Finally base and emitter electrodes 5 are contacted through the windows 4. The characteristic of this structure is that the elongation of the side lines of the emitter and the interconnection between the emitters are secured by the emitter electrode 5 on the oxidized surface film 7 as shown in FIG. 3. FIG. 3 is a view of a section of the structure shown in FIG. 2 cut along the line A–A′.

The above described two types of structures have been produced on industrial scales. The preparation procedures have become the accepted or fixed practice among transistor manufacturers. However, because these structures have enlarged base regions, the capacitance for base-collector junction is unnecessarily increased to effect objectionably the operation of the transistor. Specifically, the increased capacitance causes retarded switching operation or, in case of power transistors, a drop in power gain of the transistor.

The object of the invention is to provide a transistor structure which eliminates the above defects in the conventional structures. The invention also relates to the fabricating of this transistor.

The structure of the present transistor is characterized by the following: In the semiconductor substrate, a plurality of narrow and long base regions are provided in parallel with each of the base regions having high concentration regions and emitter regions of the width substantially the same as that of the base region provided alternately therein and the base regions and the emitter regions, respectively, are connected by a common base electrode and a common emitter electrode which are arranged in parallel and crossing with the base regions. Furthermore, two-step exposure of a light-sensitive resin is proposed. The resin is first exposed using a first glass mask, and then exposed using a second glass mask with relative position such that the second pattern crosses the first pattern forming the desired configuration.

The invention will be explained in further details. The base region in the semiconductor substrate is not formed by a single component containing all of the emitter regions, but is composed of divided, plural regions, each containing emitter regions. The basic concept of the invention lies in the elimination of unnecessary base regions between the emitter regions in the overlay transistor in order to reduce the base region to the minimum possible, thereby decreasing the capacitance of the collector-base junction. For this purpose the base region is divided. In each part, an emitter region is either between high concentration regions or at opposing positions to the high concentration regions. A base electrode is in contact with the high concentration regions, formed by the diffusion of a dopant impurity in the base regions excepting the emitter regions. Said base electrode is common for all of the base regions. Similarly, an emitter common to all of the emitter regions is in contact therewith and is obtained by eliminating the pertinent parts of the insulating layer on the emitter regions. The base electrode and the emitter electrode are in parallel.

The present transistor can be fabricated as follows: A semiconductor material of predetermined impurity concentration is subjected to known treatment to form a protective film layer for preventing indiffusion of impurity on one surface thereof of the semiconductor. The surface is further coated with a known light-sensitive resin. According to the present invention, this light-sensitive resin is exposed by means of a glass mask having a pattern of the width regulated by the envelope at one direction of the window opened by selective removal of the insulation coat in order to form a plurality of base regions which are divided and of the optional length in the said direction. Immediately thereafter, the resin coat is exposed for the second time by means of the second glass mask with position adjusted to form the base window at the predetermined position on the semiconductor substrate. This glass mask creates a pattern which crosses with the first pattern. The crossing portions form an area corresponding to the desired base window area. The developing and printing after the exposure are performed in the conventional manner. The light-sensitive resin is eliminated by any of the conventional methods for that purpose.

After the formation of the base regions, emitter regions and high concentration regions for decreasing the base connection resistance are formed in the base regions by means of a glass mask having patterns of two sizes suited to form the said regions, in the manner similar to the abovedescribed base region formation. The order of forming the high concentration regions and the base regions is not critical. After completion of the diffusion treatment, the light-sensitive resin is again evenly applied to the semiconductor substrate, and the insulation oxide film layer is selectively eliminated by using any conventional etching solution using a glass mask having a pattern of the same width as that of a side of the emitter electrode and base electrode, in the manner similar to the previously described base region formation. The base and emitter electrodes are formed, for example, by vacuum evaporation of aluminum upon the entire surface of the substrate, followed by selective partial elimination thereof by means of conventional photo-etching techniques. Because of the considerably large size of base regions, it is also possible to form the regions using a glass mask having a single pattern, instead of employing the exposure method of the present invention.

Thus, the transistor of the present invention possesses the characteristics of the overlay transistor, namely, reduction in characteristic frequency $f_T$ in the low level current region as well as in the high level current region. Furthermore, the fall in power gain in the latter area is avoided, resulting in the effective reduction of the base-collector capacitance. This last achievement is highly advantageous for circuit formation. According to our method, it is made possible to form with the mask techniques such minute regions as 2–3 $\mu$m. square, with the required precision, while conventional regions, i.e., the the window in the insulation film formed with satisfactory precision, have a side in the order of 6 $\mu$m. at the minimum. Applying this method to the present transistor, a transistor of still higher performance can be obtained.

A specific embodiment will be given with reference to FIGS. 4 and 5, thus further illustrating our invention. FIG. 5 shows a view of the section of the structure shown in FIG. 4 cut along the line B–B′.

In FIG. 4, 10 is an n-type silicon semiconductor substrate doped with antimony, having a specific resistance of 0.01∼0.03Ω cm., and is 140 $\mu$m. thick, 1 mm. long, and 1.25 mm. wide. An epitaxial layer 11 having a specific resistance of 1∼2Ω cm. and a thickness of 10 $\mu$m. was formed on the substrate. The epitaxial layer was doped with phosphorus impurity at the time of its formation and thus was of n-type. The semiconductor substrate was then inserted in a quartz tube through which oxygen was passed, while being heated to form a silicon dioxide layer 12 of a thickness of 5000∼6000 A.

The substrate was then withdrawn from the quartz tube. A light-sensitive resin such as KPR (trade name) was evenly applied to a thickness of 3000 A., onto the silicon dioxide film on the epitaxial layer. This was followed by exposure of the applied photo (light) sensitive resin surface using a glass mask printed out with gelatin having a negative pattern of 60 lines of 6$\mu$ wide and 840$\mu$ long, set up in a proper position. The development of the light-sensitive resin coat was performed using a conventional, mixed liquid of trichloroethylene and ethyl alcohol. The substrate was then again heated at 150° C. for 20 minutes, in order to enhance the adherability of the polymerized resin. The etching of the oxidized film 12 was performed in conventional manner, using an aqueous solution containing hydrofluoric acid and ammonium fluoride.

The oxidized film at the back of the substrate was protected by the prior application of wax. After the selective etching of the oxidized film, the printed resin was eliminated by dipping the substrate in boiling sulfuric acid. In order to form the base regions, the substrate was then inserted in a diffusion furnace and boron in the vapor phase was diffused therein. The resultant boron surface concentration of the base regions 13 was 5∼6 x $10^{18}$/cm.$^3$, and the depth of diffusion was 2$\mu$. In the embodiment of FIG. 4, three base regions 13 are shown, for example, 60 base regions which were disposed in parallel.

In the base regions in the substrate, high concentration regions 14 were then formed for reducing base spreading resistance in the following manner: Following the above-described diffusion treatment, the substrate was again heat oxidized in oxygen atmosphere. A light-sensitive resin, e.g. KPR, was applied to a thickness of 3000 A. The resin was subsequently subjected to the first exposure using the same glass mask employed for the diffusion treatment of the base, and then to the second exposure using a gelatin-coated glass mask having 42 negative patterns of 10$\mu$ width, the said glass mask being so positioned that the second pattern of the same mask crosses at a right angle to the first pattern. After exposure, developing and printing, the substrate was subjected to the etching treatment again using the aforesaid etching solution for the oxidized film. The substrate was then held in boiling aqueous sulfuric acid for complete removal of the printed resin. The resultant window area in the oxidized film for forming the high concentration region 14 was 6 $\mu$m. x 10 $\mu$m., and the total number of the windows was 60 x 42. The substrate was then reinserted into the diffusion furnace and subjected to the diffusion treatment in the atmosphere of gaseous boron. The boron surface concentration of the substrate thereafter became 1∼2 x $10^{19}$ cm.$^{-3}$, and the depth of diffusion $$\lesssim 2\mu\text{m}$$

Following the formation of the high concentration regions, emitter regions 15 were formed by diffusion at the base regions interposing the high concentration regions as follows: After the above diffusion treatment, the substrate was heat-oxidized in oxygen atmosphere, and was again coated with KPR to an even thickness of 3000 A. by means of a spin coating. (This rotating application apparatus is often called "spinner.") The first exposure of the resin coat was performed using a gelatin coated glass mask having 60 negative patterns of 4$\mu$ width disposed in parallel, which was so positioned that its patterns should fall on the base regions. For the second exposure a glass mask having 41 parallel negative patterns of 6$\mu$ width was employed, which was so positioned that the crossing portions of its patterns with the first patterns should fall on the interspaces among the high concentration regions.

The developing and printing was performed in the similar manner as above. In like manner, for the etching of the oxidized surface film the same etching solution was employed; the subsequent boiling treatment in the sulfuric acid of the substrate was also similar to the foregoing.

The resultant window area in the oxidized film for forming the emitter region became 4 x 6 $\mu$m., and the total number of the windows, 60 x 41. The thus treated substrate was inserted in a diffusion furnace, in which phosphorus as a dopant impurity was diffused in gaseous phase. The phosphorous surface concentration of the emitter regions was 2 x $10^{20}$/cm.$^3$, and the depth of diffusion, 1.4 $\mu$m.

The oxidized film on the emitter regions grows to a certain extent during the diffusion treatment, but it is still extremely thin compared to the film on the rest of the regions. Therefore, only the silicon surface of the initial window of oxidized film for forming the emitter is exposed by immersing the substrate into said etching solution and etching all of said oxidized film on said substrate equally without printing out the sensitive resin selectively.

The oxidized film for forming the base electrode was removed as follows: Onto the substrate a light-sensitive resin, for example KPR, was evenly applied to a thickness of 3000 A. by means of the rotation application method. Employing the first and second glass masks used for the exposure of the light-sensitive resin for forming the emitter regions, the resin was exposed after the relative positions of said glass masks were so adjusted that their patterns crossed on the high concentration regions. Following the subsequent development and printing, the substrate was dipped in the aforesaid etching solution. The resin was then removed by boiling the substrate in sulfuric acid.

Then onto the entire surfaces of the substrate, a metal, in this case aluminum, was attached to a thickness of 1.5 $\mu$m. by means of vacuum evaporation, and onto the same metallic coat a light-sensitive resin, KTFR (tradename), was daubed to a thickness of 4500 A. The resinous layer was then exposed using a glass mask onto which random paths of gelatin film were adhered by printing out at the intervals corresponding to the width of the metallic branches connecting the said electrodes, in this example, 5$\mu$. Also the surrounding of the area in the glass mask corresponding to the metal terminals for lead-out (in FIG. 4, those shown by numeral marks 16 and 17) was gelatinous film which adhered during the printing out. After the subsequent developing and printing, the substrate was dipped in a conventional, available metal-etching solution, potassium hydroxide, or phosphoric acid solution for aluminum, so that the metal layer was selectively etched. The light-sensitive resin KTFR was removed by boiling the substrate in sulfuric acid.

Although specific light-sensitive resins were given in the specific examples, it is obvious that other known light sensitive resins are equally suitable. Within the ambit of the claim other variations are also possible.

I claim:

1. A transistor comprising: a semiconductor substrate of one conductivity type forming a collector region and having formed therein a plurality of narrow and long base regions of opposite conductivity type from the semiconductor substrate, each of the base regions being separated from and parallel to each other; a plurality of high concentration regions of opposite conductivity type being formed within each of the base regions with at least two high concentration regions being formed within each of the base regions; a plurality of emitter regions of said one conductivity type, at least one being formed within each of the base regions between two said high concentration regions; an insulating coating on the semiconductor substrate; a common base electrode connecting said high concentration regions in one direction crossing with the base regions; and a common emitter electrode connecting the emitter regions in almost the same direction.

References Cited

UNITED STATES PATENTS 3,225,261 12/1965 Wolf -------------- 317—101

OTHER REFERENCES

Carley, "The Overlay Transistor," Electronics, Aug. 23, 1965, pp. 71–77.

JOHN W. HUCKERT, Primary Examiner

MARTIN H. EDLOW, Assistant Examiner

U.S. Cl. X.R.

29—589; 317—234